United States Patent [19]

Kuo

[11] 4,230,504
[45] Oct. 28, 1980

[54] METHOD OF MAKING IMPLANT PROGRAMMABLE N-CHANNEL ROM

[75] Inventor: Chang-Kiang Kuo, Houston, Tex.

[73] Assignee: Texas Instruments Incorporated, Dallas, Tex.

[21] Appl. No.: 900,549

[22] Filed: Apr. 27, 1978

[51] Int. Cl.² ............... G11C 11/40; G11C 17/00
[52] U.S. Cl. ................................. 148/1.5; 29/571; 148/187; 357/45; 357/91
[58] Field of Search ............. 365/104; 148/1.5, 187; 357/45, 91; 29/571

[56] References Cited

U.S. PATENT DOCUMENTS

| | | | |
|---|---|---|---|
| 3,852,120 | 12/1974 | Johnson et al. | 148/1.5 |
| 3,865,651 | 2/1975 | Arita | 148/187 |
| 3,887,994 | 6/1975 | Ku et al. | 29/571 |
| 3,914,855 | 10/1975 | Cheney et al. | 29/571 |
| 4,055,444 | 10/1977 | Rao | 48/1.5 |
| 4,059,826 | 11/1977 | Rogers | 365/104 |
| 4,096,522 | 6/1978 | Suzuki et al. | 356/45 |
| 4,151,020 | 4/1979 | McElroy | 148/187 |
| 4,151,021 | 4/1979 | McElroy | 148/187 |

Primary Examiner—L. Dewayne Rutledge
Assistant Examiner—Upendra Roy
Attorney, Agent, or Firm—John G. Graham

[57] ABSTRACT

An MOS read only memory or ROM is formed by a process compatible with standard N-channel silicon gate ROM manufacturing methods. Instead of moat programming or contact programming as is used in almost all standard processes, however, the ROM is programmed by implant after the polysilicon level of gates and interconnection has been deposited and patterned and prior to metal deposition. Address lines and gates are polysilicon, ground lines are defined by elongated N+ regions, and output lines are metal strips contacting the N+ diffused drains. Each potential MOS transistor in the array is programmed to be a logic "1" or "0" by ion implanting through the polysilicon gates and thin gate oxide, using patterned photoresist as a mask prior to application of the polycrystalline silicon.

8 Claims, 10 Drawing Figures

METHOD OF MAKING IMPLANT PROGRAMMABLE N-CHANNEL ROM

BACKGROUND OF THE INVENTION

This invention relates to semiconductor memory devices, and more particularly to an N-channel silicon gate MOS read only memory and a process for making it.

Semiconductor memory devices are widely used in the manufacture of digital equipment such as minicomputers and microprocessor systems. Storage of fixed programs is usually provided in these systems by MOS read only memory devices or "ROMs". ROMs are made by semiconductor manufacturers on special order, the programming code being specified by the customer. The manufacturing process is lengthy, requiring dozens of steps, each taking up time and introducing materials handling and inventory factors. Customers require the turn-around time or cycle time between receipt of the ROM code for a custom order and delivery of finished parts to be kept as short as possible. For this reason, programming should be done late in the manufacturing process, but previous ways of doing this required large cell size. The economics of manufacture of ROMs, and of mounting them on circuit boards in the system, are such that the number of memory bits per semiconductor chip is advantageously as high as possible. ROMs of up to 32K bits (32768) are typical at present. Within a few years, standard sizes will progress through 64K, 128K, 256K and 1 megabit. This dictates that cell size for the storage cells of the ROM be quite small. Metal gate ROMS of small size can be relatively easily fabricated in the manner set forth in U.S. Pat. No. 3,541,543, assigned to Texas Instruments, but usually these are programmed by the gate level mask which is at an early stage in the process. Most microprocessor and computer parts are now made by the N-channel silicon gate process because of the shorter access times provided. In the past, the N-channel process has not been favorable to layout of ROM cells of small size and/or programming has been by the moat mask, also early in the process. N-channel ROMs are disclosed in prior applications Ser. No. 762,612, filed Jan. 29, 1977 U.S. Pat. No. 4,151,020 and Ser. No. 701,932, filed July 1, 1976, abandoned assigned to Texas Instruments. A method of programming a ROM by ion implant prior to forming the polysilicon gate is shown in U.S. Pat. No. 4,059,826 to Gerald D. Rogers, assigned to Texas Instruments. Also, previous cells have been programmed at the metal level mask by contact areas between metal lines and polysilicon gates, or by contacts between metal lines and N+ source or drain regions, using excessive space on the chip.

Methods of programming N-channel ROMS by implant through polysilicon gates are shown in my prior applications Ser. No. 890,555, 890,556, and 890,557, filed Mar. 20, 1978, assigned to Texas Instruments. These methods required that no metal overlie the gates so "SATO" type processing was used so that no metal was in the ROM array, or otherwise used processing different from the standard "NSAG" which is in large volume use.

It is the principal object of this invention to provide a semiconductor permanent store memory cell of small size which may be programmed at a later stage in the manufacturing process, yet still uses the standard high volume N-channel process. Another object is to provide a small-area MOS ROM cell which is made by the standard N-channel self-aligned silicon gate manufacturing process and is programmable after the polysilicon gates have been applied and patterned.

SUMMARY OF THE INVENTION

In accordance with an embodiment of the invention, a metal-oxide-semiconductor read only memory, or MOS ROM, is formed in an integrated circuit along with other silicon gate transistors for the peripheral circuitry. The ROM is an array of potential MOS transistors where polysilicon strips on a silicon bar define the address lines and gates, and output lines are metal strips overlying the poly gates, perpendicular to the X address lines. In the array, each potential MOS transistor is a storage cell, each cell being programmed to store a logic "1" or "0" by ion implanting through the thin gate oxide and polysilicon address line which forms the gate. This ion implant step is done before the metal contacts and interconnects have been deposited and patterned, using photoresist as the implant mask.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENTS

Figure 1:
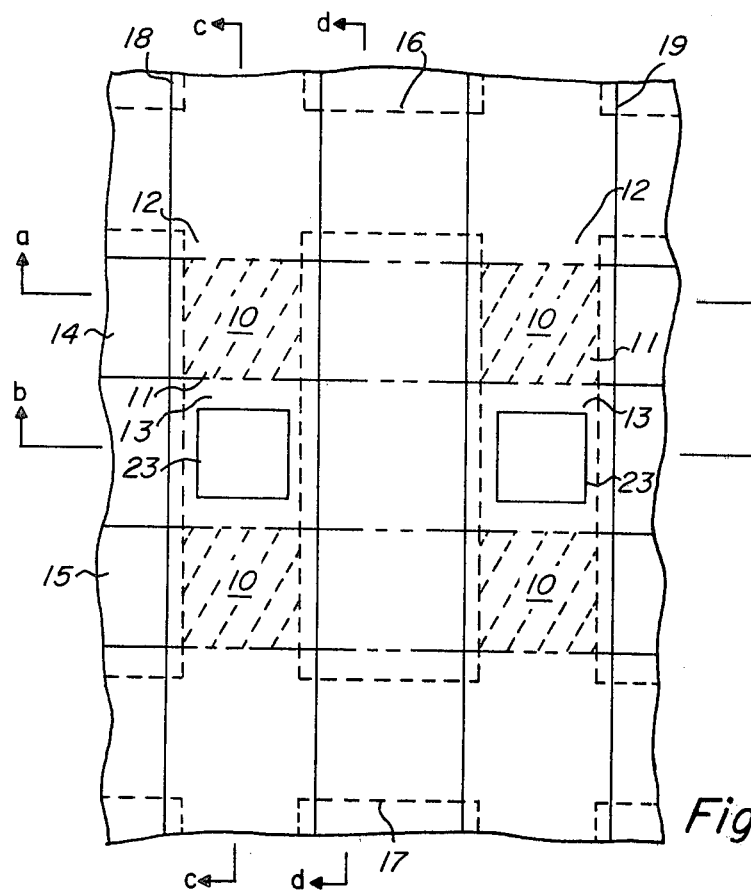
FIG. 1 is a greatly enlarged plan view of a small portion of a semiconductor chip showing the physical layout of a part of a ROM array made according to the invention.
Figure 2:
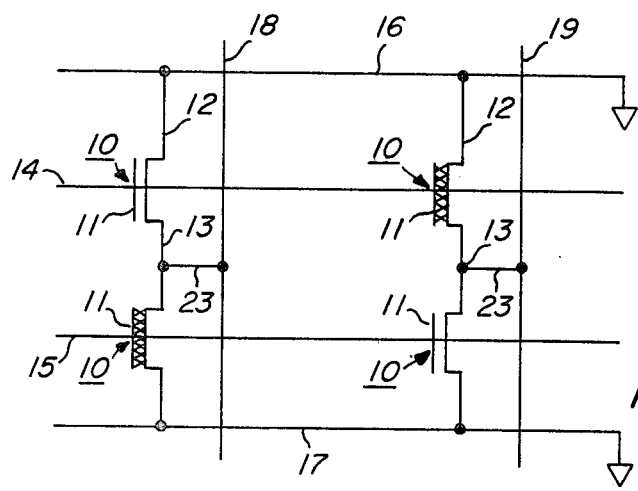
FIG. 2 is an electrical schematic diagram of the ROM of FIG. 1.
Figure 3A:
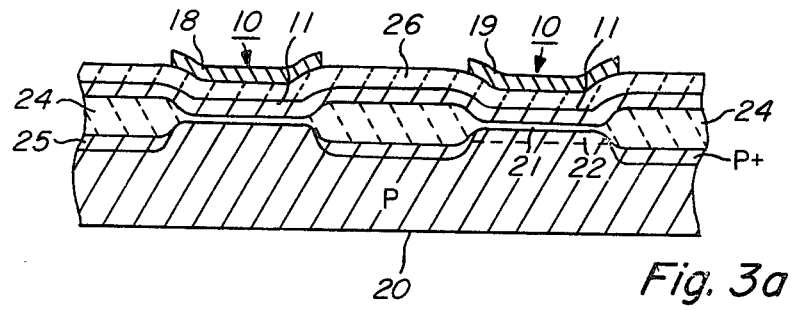
FIGS. 3a-3d are elevation views in section of the cell of FIG. 1, taken along the lines a—a, b—b, c—c, and d—d, respectively.
Figure 3B:
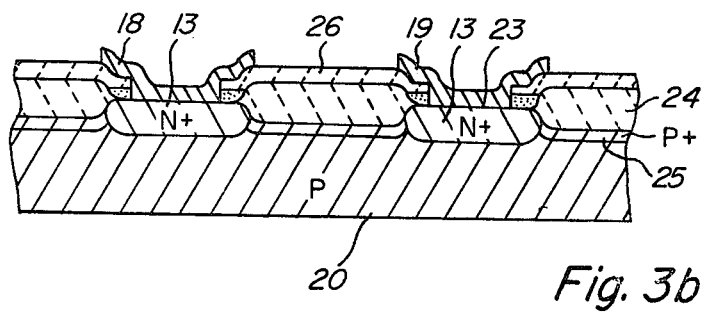
Figure 3C:
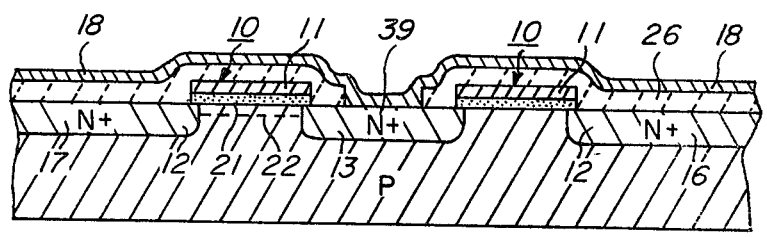
Figure 3D:
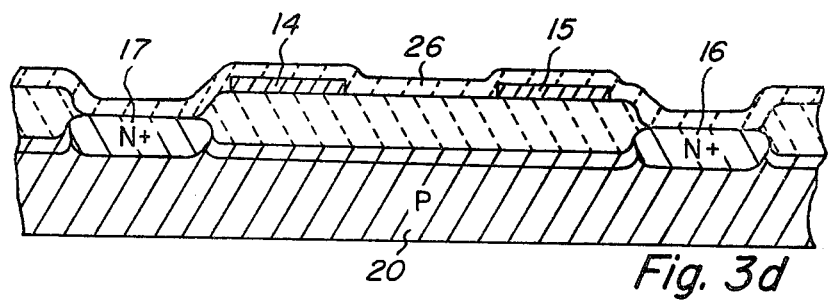

With reference to FIGS. 1, 2, and 3a-3d, a read only memory is illustrated which is programmed according to the invention. The array consists of a large number of cells 10, only four of which are shown. Each cell is an MOS transistor having a gate 11, a source 12 and a drain 13. The gates 11 are parts of polysilicon strips 14 and 15 which are the X address lines for the array. The sources are part of N+ diffused regions 16 and 17 which are connected to ground or Vss, while the drains are part of N+ diffused regions which are connected to metal Y output lines 18 and 19. The array, formed on a silicon bar 20, would typically contain perhaps 64K, 128K or 256K cells, so the bar would be less than about 200 mils on a side or 40,000 sq. mil area depending upon the bit density. The four cells 10 shown would be on a minute part of the bar, perhaps one or two mils wide. A 64K ROM would require 256 of the X address lines such as 14 and 15 and 256 of the Y lines like the lines 18 and 19, providing 65,536 bits.

The cell array is programmed by boron implant through the polycrystalline silicon strips 14 and 15 and the gate oxide 21 to raise the threshold voltage of selected ones of the cells 10 to a value above that which will be turned on by the voltage on the selected address line 14, 15, etc. In the example of four cells shown, the upper right cell and the lower left cell are implanted in this manner, the others are not. The ion implant creates implanted regions 22 in the channel areas of the selected transistors 10. The regions 22 are doped more heavily P-type than the original silicon substrate 20.

A thick protective oxide layer (not shown) covers the metallization, with aperatures etched in this layer above bonding pads. This layer is non-thermal oxide deposited at low temperature in accord with standard MOS manufacturing methods. Usually this oxide covers everything except the bonding pads on a bar.

A thick field oxide coating 24 covers parts of the bar not occupied by the transistors of diffused interconnects, and P+ channel stop regions 25 are formed underneath all the thick field oxide. An interlevel oxide coating 26 is provided between the polysilicon strips 14, 15 and the metal strips 18 and 19.

Turning now to FIGS. 4a-4d, a process for making the ROM array of the invention will be described. The right hand side of these FIGURES corresponds to the section view of FIG. 3a, while the left hand side shows the formation of an N-channel silicon gate transistor of conventional form on the periphery of the chip, i.e., not in the cell array. The starting material is a slice of P-type monocrystalline silicon, typically 3 inches in diameter and twenty mils thick, cut on the <100> plane, of a resistivity of about 6 to 8 ohm-cm. As above, in the FIGURES the portion shown of the bar 20 represents only a very small undivided part of the slice, perhaps 1 or 2 mils wide for each part. After appropriate cleaning, the slice is oxidized by exposing to oxygen in a furnace at an elevated temperature of perhaps 1100 degrees C. to produce an oxide layer 31 over the entire slice of a thickness of about 1000 Angstroms. Parts of this layer 31 may stay in place to become the gate insulator areas 21, but usually the layer is later removed and new gate oxide grown. Next, a layer 32 of silicon nitride of about 1000 Angstroms thickness is formed over the entire slice by exposing to an atmosphere of silane and ammonia in an rf plasma reactor. A coating of photoresist is applied to the entire top surface of the slice, then exposed to ultraviolet light through a mask which defines the desired pattern of the thick field oxide 24 and the P+ channel stop 25. The resist is developed, leaving areas where nitride is then etched away by a nitride etchant, removing the exposed part of the nitride layer 32 but leaving in place the oxide layer 31; the nitride etchant does not react with the photoresist.

Using photoresist and nitride as a mask, the slice is now subjected to an ion implant step to produce the channel stop regions 25, whereby boron atoms are introduced into unmasked regions 33 of silicon. The oxide layer 31 is left in place during the implant because it prevents the implanted boron atoms from out-diffusing from the surface during subsequent heat treatment. This implant is at a dosage of about $10^{13}$ per sq. cm at 150 KeV. The regions 33 do not exist in the same form in the finished device, because some of this part of the slice will have been consumed in the field oxidation procedure. Usually the slice would be subjected to a heat treatment after implant but prior to field oxide growth, as set forth in U.S. Pat. No. 4,055,444, assigned to Texas Instruments.

Figure 4A:
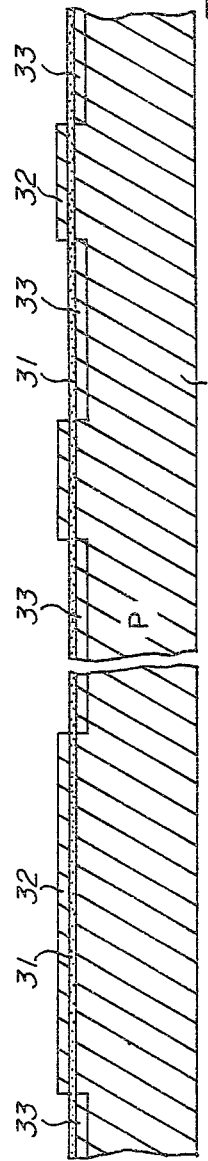
FIGS. 4a-4d are elevation views in section of the ROM array and a transistor in the peripheral part of the semiconductor device of FIGS. 1 and 3a-3d, at successive stages in the manufacturing process, taken generally along the line a—a in FIG. 1.
Figure 4B:
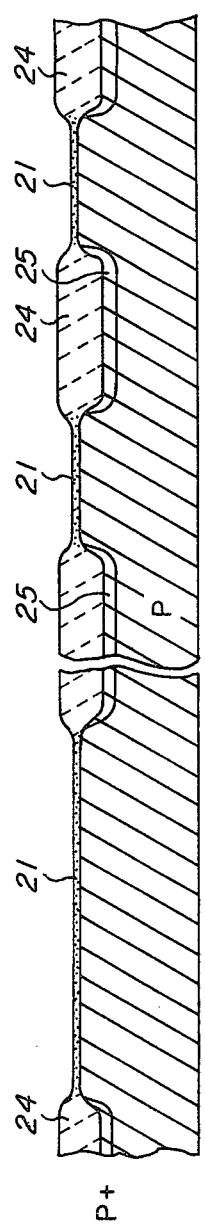

The next step in the process is formation of field oxide 24, which is done by subjecting the slices to steam or an oxidizing atmosphere at about 1000 degrees C. for perhaps several hours. This causes a thick field oxide region or layer 24 to be grown as seen in FIG. 4b. This region extends into the silicon surface because silicon is consumed as it oxidizes. The remaining parts of the nitride layer 32 mask oxidation. The thickness of this layer 24 is about 10,000 Angstroms, about half of which is above the original surface and half below. The boron doped P+ regions 33 formed by implant will be partly consumed, but will also diffuse further into the silicon ahead of the oxidation front. Thus, P+ field stop regions 25 will result which will be much deeper than the original regions 33.

Next the remaining nitride layer 32 is removed by an etchant which attacks nitride but not silicon oxide, then the oxide 31 is removed by etching and the exposed silicon cleaned. The gate oxide 21 is grown by thermal oxidation to a thickness of about 500 to 800 Angstroms. In areas of the slice where depletion load devices are required, although not pertinent to this invention, a masked ion implant step would be done at this point. Likewise, the threshold voltage of the enhancement mode transistors in the ROM array or periphery may be adjusted by ion implant. Also, windows for polysilicon to silicon contacts, if needed, are patterned and etched at this point using photoresist; none are needed in the ROM array itself or the peripheral transistor shown.

Figure 4C:
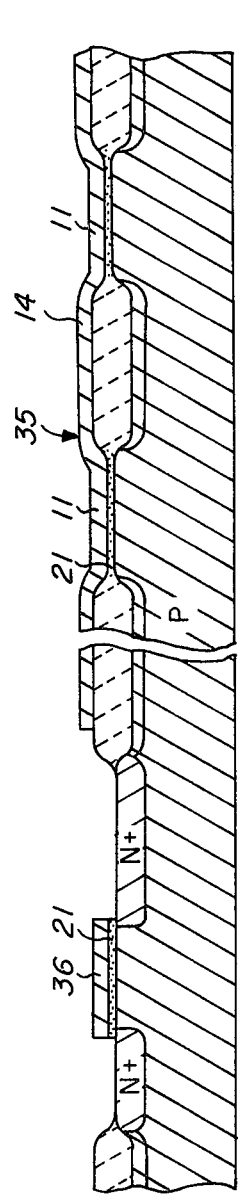

As seen in FIG. 4c a layer 35 of polycrystalline silicon is deposited over the entire slice in a reactor using standard techniques. Since the implant for programming penetrates this layer of polysilicon, the thickness is only about 3000 Angstroms, compared to about 5000 in the usual silicon gate process. This layer is doped with phosphorus by the later N+ diffusion to make it highly conductive. The polysilicon layer 35 is patterned by applying a layer of photoresist, exposing to ultraviolet light through a mask prepared for this purpose, developing, then etching both photoresist and exposed oxide. The remaining photoresist masks the gate areas of the polysilicon and the lines 14 and 15, as well as the gates of peripheral transistors and inter-connections or other parts of the circuit on the chip. The unmasked polycrystalline silicon is etched away, so the resulting structure seen in FIG. 4d includes a part of the remaining polysilicon layer 35 which provides what will be a gate 36 of a peripheral N-channel MOS transistor, the gates 11 in the ROM array, as well as the line 14. The thin oxide 21 underneath the gate areas of 36 is the gate oxide of the transistor. The ground lines 40 will be exposed, as will the sources and drains 12 and 13. The slice is next subjected to a standard N+ diffusion whereby the N+ regions are formed using the gate oxide 21 and the field oxide as a diffusion mask.

A layer 26 of silicon oxide is deposited by decomposition of silane at a low temperature, about 400 degrees C. This layer insulates the metal level from the polycrystalline silicon level 35 of interconnections and gates and is referred to as multilevel oxide.

The multilevel oxide layer 26 is now patterned by a photoresist operation, exposing contact area 39 for a metal-to-silicon contact, as well as contact areas for metal contacts and interconnections used in the periphery of the chip in the input buffers, decoders, sense amplifiers, substrate pump, and the like.

Up to this point in the process all slices are exactly the same as no programming has been done in the ROM array. The slices are processed routinely to this stage with no requirement for separate inventory controls and separate identification of each lot. An inventory of slices finished up through this stage may be maintained for quick response to custom orders for ROM codes.

Figure 4D:
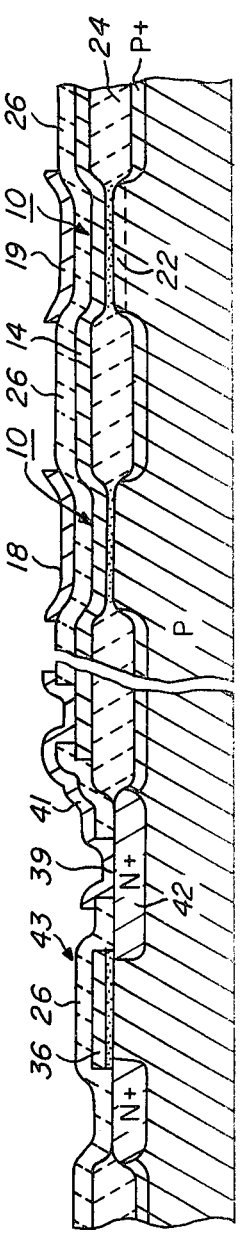

It is at this point, or preferably prior to deposition of multilevel oxide, that the implant programming is done. In accordance with the primary feature of the invention, referring to FIG. 4f, the ROM array is programmed by first depositing photoresist then exposing it using a unique mask which defines the ROM code. After developing an aperture 22 is defined over each cell 10 to be programmed as a "0", and each cell 10 to be a "1" is left covered. The slice is then subjected to a boron implant at about 180 KeV to a dosage of about $10^{13}$ per sq. cm. The energy level and dosage are dependent upon the thicknesses of the oxide layer 21 and the polysilicon gates 11, as well as the change in threshold desired. At this level, the ion implant penetrates the polycrystalline silicon gate 11 and gate oxide 21 to create an implanted region 22 in the channel area. This implant raises the threshold voltage above about 5 V. Since the part operates on a supply voltage Vdd of 5 V., the full logic 1 level will not turn on the transistor. The transistors covered by the photoresist will not be implanted so will retain the usual threshold voltage of about 0.8 V. It is important to note mask alignment for creating the apertures 22' for the programming mask is non-critical. The active channel area to be implanted has already been defined in previous processing step with thin gate oxide 21. The implanted ions are activated by the standard 450° C. sintering step after metallization. The metal contacts and interconnections are made in the usual manner by depositing a thin film of aluminum over the entire top surface of the slice then patterning it by a photoresist mask and etch sequence. This leaves metal strips 18 and 19 which are the Y lines and also a strip 41 connecting the source 42 of N-channel silicon gate transistor 43 to a contact area at one end of the polysilicon X address line 14 as seen in FIG. 4d.

In operation, the X address selects one of the lines 14 or 15, or one of the other of the 256 such lines in a 64K ROM, and this selected line is held at logic 1 level or about +5 V. The remaining lines are held at Vss, logic 0. The Y address selects one of the 256 lines such as 18 and 19 and this line is connected, via the Y decoder to the output. For dynamic ROMs, the Y lines usually would be precharged prior to an access cycle, so the selected line will conditionally discharge depending upon whether the selected bit at the intersection of the addressed X and Y lines is programmed a 1 or a 0.

The purpose of the ion implant for programming the cell array is to change the threshold voltage of some of the transistors 10 relative to the others, depending upon whether a 1 or a 0 is to be stored. A ROM cell can be either normally on or normally off when selected. The feature of this invention can be used in either P-channel or N-channel ROMS, so, depending on channel type and whether the cells are to be normally on or normally off when selected, the proper type of dopant for ion implant is determined. In the embodiment described in detail above, a boron implant is used to increase the threshold voltage such that a transistor 10 is off when selected. The normally on device can be either enhancement or depletion mode. In another example, such as series ROM of U.S. Pat. No. 4,059,826 mentioned above, the ion implant would lower the threshold to depletion mode.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A method of making a read-only-memory array, while at the same time forming N-channel silicon gate transistors peripheral to the array, comprising the steps of: forming a plurality of N-channel silicon gate memory transistors in a face of a semiconductor body, and at the same time forming a plurality of said peripheral transistors spaced from the array, each of the transistors having a source, a drain and a silicon gate, the memory transistors being in a regular pattern to provide an array of memory cells; programming the array of memory cells by masked ion implant penetrating through the silicon gates of selected ones of the field effect transistors while shielding the peripheral transistors; and thereafter applying patterned metal contacts and interconnections on said face.

2. A method according to claim 1 wherein a plurality of other transistors and a plurality of contacts and interconnections are formed on said face peripheral to the array, wherein the step of programming uses a mask comprising of a coating of photoresist applied before said contacts and interconnections have been formed.

3. A method according to claim 2, wherein the field effect transistors and the other transistors are N-channel silicon gate transistors, and the contacts and interconnections are formed by metal deposited uniformly in a thin film and patterned.

4. A method according to claim 3 wherein the semiconductor body is P-type silicon, the sources and drains are N-type, and the ion implant is P-type.

5. A method a read-only-memory which includes the steps of: forming a plurality of N-channel insulated gate field effect memory transistors in a face of a semiconductor body and at the same time forming a plurality of N-channel insulated gate field effect peripheral transistors in said face, each of the transistors having a source, a drain and a gate, the memory transistors being in a regular pattern to provide an array of memory cells; forming a plurality of metal contacts and inter connections on said face; programming the array of memory cells by ion implant through the gates of selected ones of the memory transistors using a mask applied before said metal contacts and interconnections have been formed, while the gates of the peripheral transistors are shielded.

6. In a method according to claim 5, the step of programming using a mask comprising a patterned coating of photoresist.

7. In a method according to claim 5, the field effect transistors and the other transistors being N-channel silicon gate transistors, the semiconductor body being P-type silicon, the sources and drains being N-type, and the ion implant being P-type.

8. A method of making a semiconductor device comprising the steps of: forming a plurality of first circuit elements in a face of a semiconductor body while at the same time forming a plurality of second circuit elements in said face spaced from the first circuit elements; each of the circuit elements having electrodes in the face and a poly silicon control electrode overlying the face: the first circuit elements having a metal interconnection overlying the poly silicon control electrode; the second circuit elements having no metal interconnection over the control electrode; and changing the characteristics of the first circuit elements by ion implant through the poly silicon control electrodes of selected ones of the circuit elements using a mask while shielding the second circuit elements, the ion implant being prior to deposition of the metal interconnection.

* * * * *

REEXAMINATION CERTIFICATE (3146th)

United States Patent [19]

Kuo

[11] B1 4,230,504

[45] Certificate Issued Mar. 4, 1997

[54] METHOD OF MAKING IMPLANT PROGRAMMABLE N-CHANNEL ROM

[75] Inventor: Chang-Kiang Kuo, Houston, Tex.

[73] Assignee: Texas Instruments Inc., Dallas, Tex.

Reexamination Request:
No. 90/004,249, May 28, 1996

Reexamination Certificate for:
Patent No.: 4,230,504
Issued: Oct. 28, 1980
Appl. No.: 900,549
Filed: Apr. 27, 1978

[51] Int. Cl.$^6$ ............................................. H01L 21/265
[52] U.S. Cl. ............................ 437/48; 437/52; 437/45
[58] Field of Search ........................... 437/48, 45, 52; 257/390–391

[56] References Cited

U.S. PATENT DOCUMENTS 4,129,936  12/1978  Takei ........................ 29/571

*Primary Examiner*—H. Jey Tsai

[57] ABSTRACT

An MOS read only memory or ROM is formed by a process compatible with standard N-channel silicon gate ROM manufacturing methods. Instead of moat programming or contact programming as is used in almost all standard processes, however, the ROM is programmed by implant after the polysilicon level of gates and interconnection has been deposited and patterned and prior to metal deposition. Address lines and gates are polysilicon, ground lines are defined by elongated N+ regions, and output lines are metal strips contacting the N+ diffused drains. Each potential MOS transistor in the array is programmed to be a logic "1" or "0" by ion implanting through the polysilicon gates and thin gate oxide, using patterned photoresist as a mask prior to application of the polycrystalline silicon.

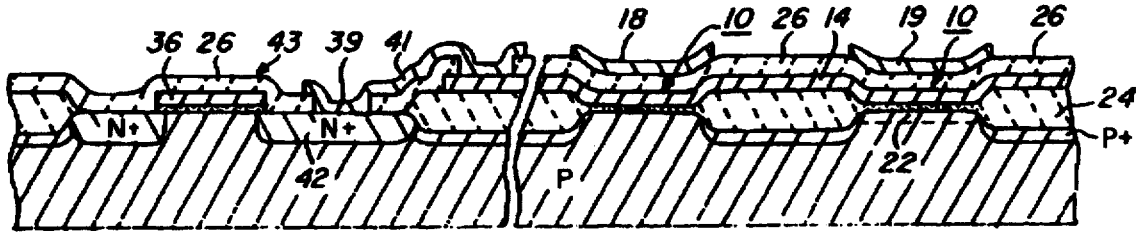

REEXAMINATION CERTIFICATE ISSUED UNDER 35 U.S.C. 307

NO AMENDMENTS HAVE BEEN MADE TO THE PATENT.

AS A RESULT OF REEXAMINATION, IT HAS BEEN DETERMINED THAT:

The patentability of claims 1–8 is confirmed.

\* \* \* \* \*